Feb. 23, 1965 R. LORENZ 3,171,039

FLIP-FLOP CIRCUIT

Filed Dec. 23, 1960 3 Sheets-Sheet 1

INVENTOR.
RAY LORENZ
BY
Herbert [signature]
ATTORNEY

INVENTOR.
RAY LORENZ
BY
Herbert F. Somermeyer
ATTORNEY

Feb. 23, 1965

R. LORENZ 3,171,039

FLIP-FLOP CIRCUIT

Filed Dec. 23, 1960

3 Sheets-Sheet 3

INVENTOR
RAY LORENZ
BY [signature]
ATTORNEY

United States Patent Office 3,171,039
Patented Feb. 23, 1965

3,171,039

FLIP-FLOP CIRCUIT

Ray Lorenz, Culver City, Calif., assignor to Sperry Rand Corporation, New York, N.Y., a corporation of Delaware Filed Dec. 23, 1960, Ser. No. 78,047
11 Claims. (Cl. 307—88.5)

This invention relates to bistable multivibrator circuits, often called flip-flops, and has particular reference to a class of such circuits that utilizes semiconductor devices and is triggered by the trailing edge of an electrical impulse.

In digital equipment it is quite often desirable to control a signal from an AND gate by one input pulse signal. Such equipment generally utilizes a flip-flop output which is coincident with the flip-flop trigger signal. Frequently input pulse signals not possessing the magnitude or form characteristics of a correct pulse signal will trigger the flip-flop, thereby permitting erroneous digital signals to be transmitted from the AND gate. The primary object of this invention is to provide a flip-flop which will be triggered from one stable state to the other stable state only by a pulse having predetermined magnitude and fall-time characteristics. By using the trailing edge of the input pulse signal to trigger the flip-flop a flip-flop becomes insensitive to pulse duration variations, and by a proper selection of circuit components and voltage sources a flip-flop becomes insensitive to insufficient pulse magnitudes and form characteristics of operating pulse functions that may be applied to the flip-flop inputs.

Accordingly, it is an object of this invention to provide an improved bistable multivibrator circuit for digital computers.

A related object of this ivnention is to provide an improved semiconductor building block circuit.

Other objects and advantages of this invention will become obvious to those having ordinary skill in the art by reference to the following detailed description of exemplary embodiments of the apparatus and the appended claims. The various features of the exemplary embodiments may best be understood with reference to the following drawings wherein:

Figure 1:
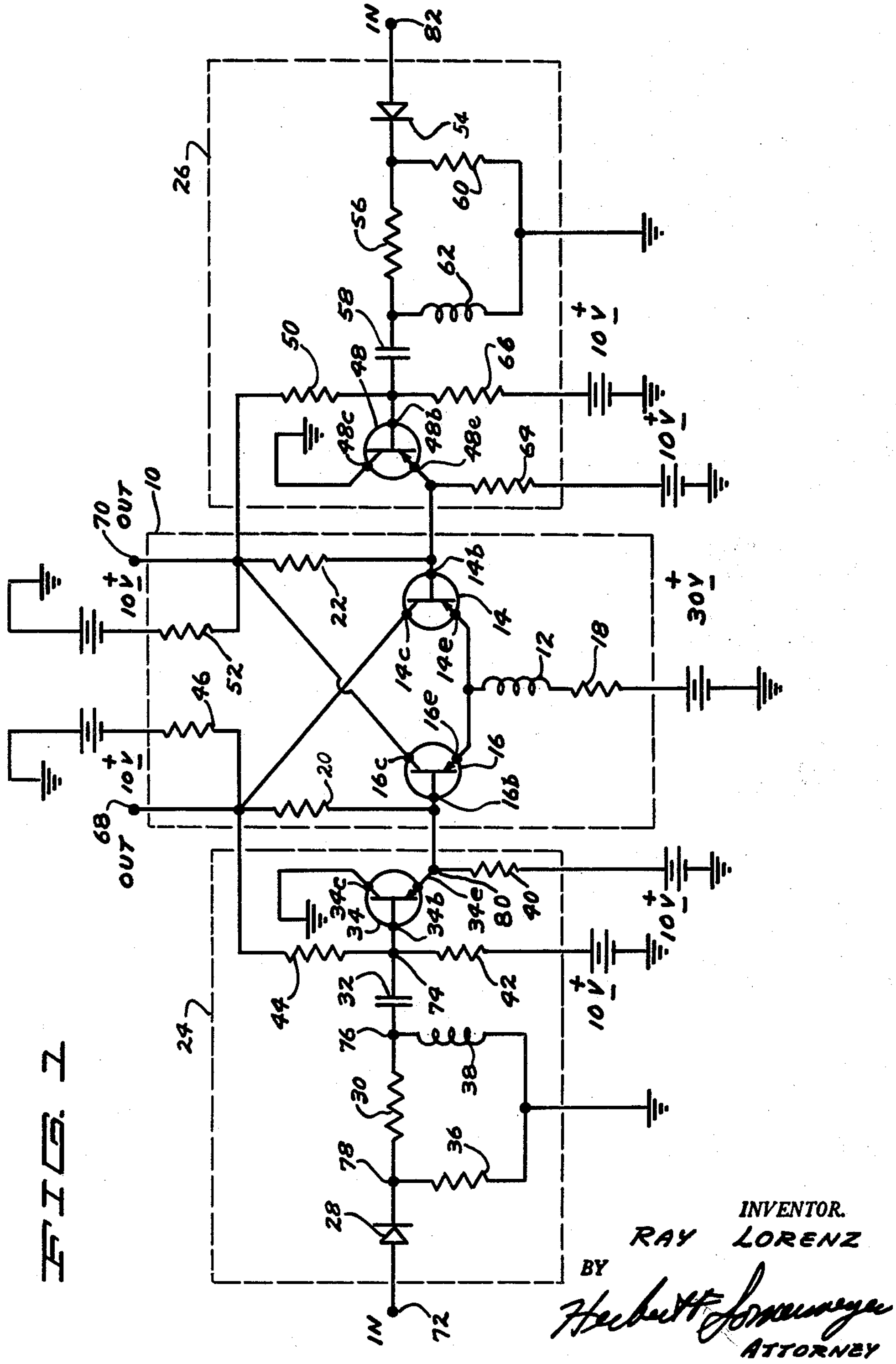
FIGURE 1 is a circuit diagram illustrating an exemplary embodiment of this invention.

The preferred embodiment of this invention is illustrated in FIGURE 1 wherein dashed box 10 contains the schematic of a conventional common-emitter bistable multivibrator with the addition of an inductor 12. The operation of such a conventional circuit is explained in "Transistor Electronics," Lo et al., Prentice-Hall, Inc., Englewood Cliffs, N.J., 1955, beginning on page 468 and with reference to FIGURES 12–34. To switch conduction from a conducting active element, transistor 14, to a nonconducting active element, transistor 16, a single negative pulse may be applied to the control electrode 16*b* of transistor 16. This negative pulse causes the control electrode 16*b*, the base of transistor 16, to be driven negative with respect to the emitter 16*e* of transistor 16 which causes transistor 16 to conduct. Upon conduction the voltage drop through the resistor 18 due to current flow through the transistor 16 causes the potential of the collector 16*c* of the transistor 16 to become positive with respect to the collector 14*c* of the transistor 14. The collectors and bases of the transistors 14 and 16 are cross-coupled by the resistor 20 and 22, respectively, and the increasing positive state of the collector 16*c* of transistor 16 is coupled to the base 14*b* of transistor 14 which effect drives the base 14*b* of transistor 14 toward a more positive state with respect to the emitter 14*e* of transistor 14. This positive going relationship of base 14*b* to emitter 14*e* starts to cut off conduction of transistor 14 and in accordance with the referenced text noted above causes transistor 16 to proceed to the conducting state and transistor 14 to proceed into the nonconducting state. As is common to all bistable multivibrators, transistors 14 and 16 will remain in this state until triggered by a single negative pulse applied to the control electrode 14*b* of the then nonconducting active element, transistor 14. Likewise, application of a single negative pulse to the control electrode 16*b* of the then conducting active element, transistor 16, will have no effect upon the relative states of the subject transistors.

Subsequent detailed discussion of the operation of the circuit of FIGURE 1 will point out the advantages derived by the addition of inductor 12 to the conventional common-emitter bistable multivibrator circuit depicted in the referenced text.

Referring now to FIGURE 1 there is shown a bistable multivibrator dashed box 10, similar to a common Eccles-Jordan configuration, and two substantially similar input circuit means dashed boxes 24 and 26. The improvement to the present state of the art of logical flip-flops which is presented by this invention includes the combination of the novel pulse forming means illustrated in the dashed boxes 24 and 26 and the inductor 12 with the common-emitter configuration of dashed box 10.

A unidirectional impedance means 28, preferably a germanium diode, with its orientation such as to present a low impedance to an input pulse of positive polarity is serially associated with resistor 30, capacitor 32, and the base 34*b* of transistor 34. A source of ground potential is coupled to the junction of resistor 30 and diode 28 through resistor 36, to the junction of resistor 30 and capacitor 32 through inductor 38, and directly to the collector 34*c* of transistor 34. A source of positive 10 volts direct-current potential is coupled to the emitter 34*e* of transistor 34 through resistor 40 and to the base 34*b* of transistor 34 through resistor 42. Collector 14*c* of transistor 14 is coupled to the base 16*b* of transistor 16 through resistor 20, to the base 34*b* of transistor 34 through resistor 44, and to a source of negative ten volts direct-current potential through resistor 46. Emitters 16*e* and 14*e* of transistors 16 and 14, respectively, are coupled directly to each other and then to a source of positive thirty volts direct-current potential through serially associated inductor 12 and resistor 18 respectively. Collector 16*c* of transistor 16 is coupled to the base 14*b* of transistor 14 through resistor 22, to the base 48*b* of transistor 48 through resistor 50, and to a source of negative ten volts direct-current potential through resistor 52. A unidirectional impedance means 54, preferably a germanium diode, with its orientation such as to present a low impedance to an input pulse of positive polarity is serially associated with resistor 56, capacitor 58, and the base 48*b* of transistor 48. A source of ground potential is coupled to the junction of resistor 56 and diode 54 through resistor 60, to the junction of resistor 56 and capacitor 58 through inductor 62, and directly to the collector 48*c* of transistor 48. A source of positive ten volts direct-current potential is coupled to the emitter 48*e* of transistor 48 through resistor 64 and to the base 48*b* of transistor 48 through resistor 66. Emitter 34*e* of transistor 34 is coupled directly to the base 16_b_ of transistor 16. Emitter 48_e_ of transistor 48 is coupled directly to the base 14_b_ of transistor 14. Point 72 serves as an input terminal and emitter 34_e_ of transistor 34 serves as an output terminal for input circuit means dashed box 24 while point 82 serves as an input terminal and emitter 48_e_ of transistor 48 serves as an output terminal for input circuit means dashed box 26. Points 68 and 70 serve as output terminals and base 16_b_ of transitsor 16 and base 14_b_ of transistor 14 serve as input terminals for the bistable multivibrator circuit of dashed box 10.

In order to facilitate an understanding of the operation of this invention the following set of actual values for the elements of FIGURE 1 are presented. It should be understood that the principles of operation of this circuit may be present in circuits having a wide range of individual specifications so that the list of values here presented should not be construed as a limitation.

Transistors 14, 16, 34, and 48—Germanium PNP-$h=0.98$-$f_{co}=10$ megacycle, for example GE type 2N43.

Diodes 28 and 54—Germanium junction type, for example Sylvania type 1N34.

| | |
|---|---|
| Inductors **38** and **62** | 150 microhenries. |
| Inductor **12** | 300 microhenries. |
| Resistors **18**, **46** and **52** | 360 ohms. |
| Resistors **36**, **42**, **60** and **66** | 1.0K ohms. |
| Resistors **40** and **64** | 180 ohms. |
| Resistors **30** and **56** | 470 ohms. |
| Resistors **20** and **22** | 15.0K ohms. |
| Resistors **44** and **50** | 8.2K ohms. |
| Capacitors **32** and **58** | 270 micromicrofarads. |

Using the above values, in operation in the no input signal condition, transistors 34 and 48 are conducting in the nonsaturating mode, transistor 14 is conducting in the nonsaturating mode, and transistor 16 is operating in the nonconducting mode. As transistors 34 and 48 are in the emitter-follower configuration their base-to-emitter resistance is negligible and it is thus assumed that the potential of said emitters is approximately equal to the potential of said bases respectively. Actually, the potential difference therebetween may be of the order of 0.1 volt. The base and emitter of transistor 34, as with transistor 48, are at a potential of approximately +9.7 volts. The bases of transistors 16 and 14 are connected directly to the emitters of transistors 34 and 48 and thus these said bases are likewise at a potential of approximately +9.7 volts. Transistor 16 is operating in its nonconducting mode providing high emitter-to-collector resistance. Transistor 14 is operating in its nonsaturating mode with its collector at a potential of approximately +7.0 volts, its emitter at a potential of approximately +10.0 volts, and with its base at a potential of approximately +9.7 volts. As noted above transistor 16 is operating in its nonconducting mode due to the lock-out arrangement of the cross coupling resistors 20 and 22, and the common-emitter resistor 18 and inductor 12. With transistor 16 nonconducting the voltage divider network of resistances 64, 22, and 52 maintain a static output of approximately ground potential at point 70. Thus with the values noted above the following output relationships exist: with transistor 16 conducting the output at point 68 is approximately ground potential and the output at point 70 is approximately +7.0 volts, with transistor 14 conducting the output at point 70 is approximately ground potential and the output at point 68 is approximately +7.0 volts.

The foregoing describes the condition of the circuit of FIGURE 1 prior to the application of a positive pulse to point 72.

Figure 4:
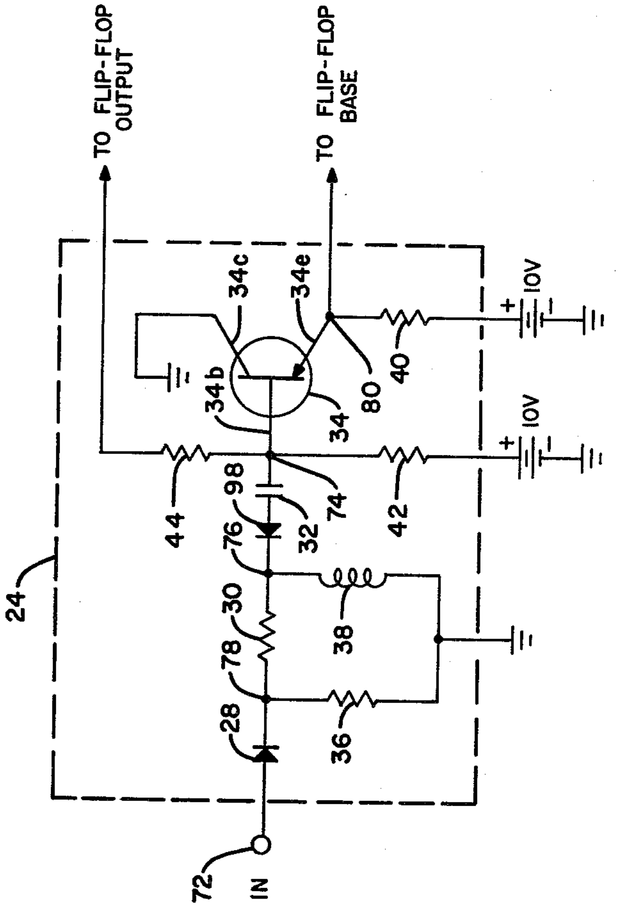
FIGURE 4 is a circuit diagram illustrating an exemplary embodiment of the flip-flop triggering circuit.

When a positive pulse is applied to point 72, diode 28 acts as a low impedance and the positive pulse passes through resistor 30 to capacitor 32 which couples the leading edge of such pulse to point 74. As point 74 is raised in potential by the leading edge of the positive pulse, the base of transistor 34 is raised in potential until it reaches a value of approximately +10.0 volts which cuts off transistor 34. This positive excursion will appear at the base 16_b_ of transistor 16 and will be somewhat less than +1.0 volt. This change has little or no effect on the condition of transistor 14 when the values noted above are employed. It has been found, however, that with a selection of values different than that listed above this positive excursion appearing at the base 16_b_ of transistor 16 may be of sufficient magnitude to drive base 14_b_ of transistor 14 sufficiently positive with respect to the emitter 14_e_ of transistor 14 to cut off transistor 14 and turn on transistor 16. To avoid this undesirable result a diode 98, as shown in FIG. 4, is oriented so as to present a high impedance to an input pulse of positive polarity may be inserted between point 76 and capacitor 32. Addition of this diode 98 will preclude a positive pulse from being impressed on the base 34_b_ of transistor 34 although a negative pulse will pass relatively unimpeded from point 76 to the base 34_b_ of transistor 34. Since the circuits contained in dashed boxes 24 and 26 are identical, the diode 98 can be added to both input circuits to achieve the desired results.

The positive pulse from point 76 is likewise impressed upon inductor 38. During passage of the leading edge of such pulse inductor 38 acts as a high impedance to ground, and until passage of such pulse acts as an energy storage device or "tank." Upon passage of the trailing edge of such pulse inductor 38 discharges the energy stored therein through resistor 30 and is directed, or steered, by diode 28 through resistor 36 to ground. Passage of this energy, or current, through resistor 30 from point 76 to point 78 causes a voltage drop across resistor 30 with point 76 taking a potential drop during passage of such current. This potential drop is seen by capacitor 32 as a negative going pulse which pulse is thereby impressed upon point 74 and the base 34_b_ of transistor 34. This negative pulse lowers the potential of the base 34_b_ of transistor 34 below that of the emitter 34_e_ of transistor 34 causing transistor 34 to initiate non-conduction thereby resulting in a negative pulse at point 80 which being connected directly to the base 16_b_ of transistor 16 causes transistor 16 to initiate conduction which in turn initiates transistor 16 emitter current flow from the source of positive thirty volts direct-current potential through resistor 18 and inductor 12.

The addition of inductor 12 to the otherwise conventional bistable multivibrator, or flip-flop, of dashed box 10 causes the source of positive thirty volts direct-current potential to act as a constant current source. Thus as transistor 16 conducts its emitter current is subtracted from the current available for the emitter 14_e_ of transistor 14. This in effect causes transistor 14 to act as if in a common-base configuration with constant base current and varying emitter current. This configuration accelerates the switching action of the flip-flop of the dashed box 10 and results in a faster and sharper response to the input pulse than otherwise available without the addition of inductor 12. The foregoing description of the operation of the preferred embodiment of this invention as depicted in FIGURE 1 is equally applicable to the application of an input pulse signal to point 82 with dashed box 26 serving as the pulse forming network to trigger the flip-flop of dashed box 10. Further, it should be apparent to one skilled in the art that by a simple change in circuit components and potentials the circuit of FIGURE 1 may be converted to a negative input pulse signal triggered device from the depicted positive input pulse signal triggered device.

Figure 2:
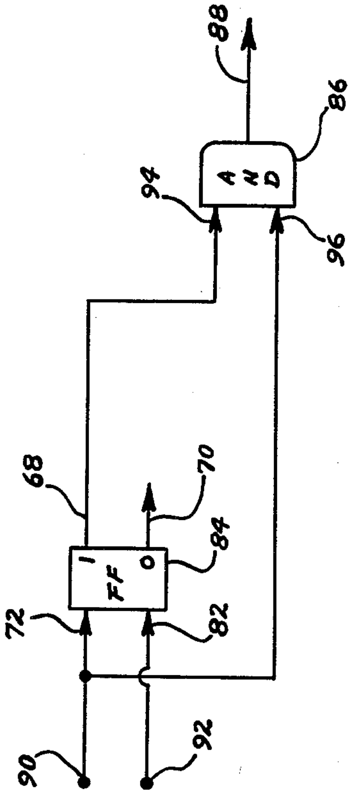
FIGURE 2 is a block diagram illustrating an exemplary employment of this invention in association with an AND gate.
Figure 3:
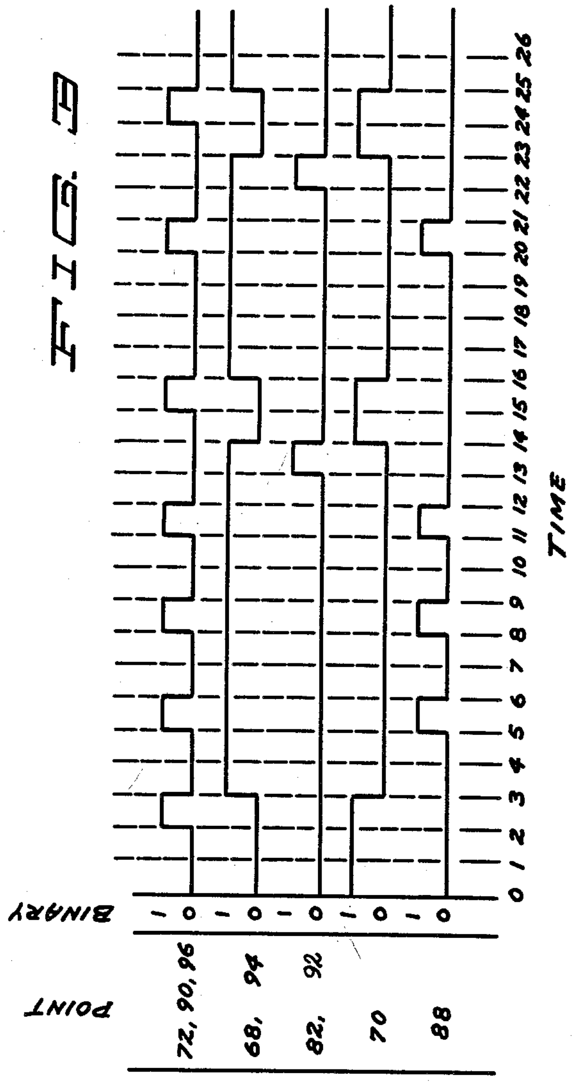
FIGURE 3 illustrates exemplary waveforms taken from the circuit of FIGURE 2 with one-half microsecond duration input pulse signals of 5 volts magnitude and at a varying pulse repetition rate.

An exemplary employment of this invention is depicted in FIGURE 2. Flip-flop 84 is shown with the input terminals, point 72 and point 82, and the output terminals, point 68 and point 70, as designated in FIGURE 1, and AND gate 86 which is of the conventional design of a positive-AND logical element. At time $t_0$ with flip-flop 84 set in the state which provides a low level output at point 68, which is equivalent to a binary —0—, gate 86 does not have a high level signal, equivalent to a binary —1—, applied at either point 94 or point 96. A positive pulse initiated at time $t_2$ and applied at point 90, triggers flip-flop 84 and results at time $t_3$ in a binary —1—, at point 68. This output is also present at point 94 of gate 86, and prepares gate 86 for the next positive pulse which when applied to point 90, and consequently at point 96, will present coincident binary —1— at point 94 and point 96. The positive pulse applied at point 90 which has set flip-flop 84 to a binary —1— output at point 68 has in effect been delayed a period of time equal to its width. This delay assures that the positive pulse at point 96 will not be coincident with the binary —1— at point 94. This noncoincidence precludes a binary —1— from appearing at the output of gate 86 at point 88. The next positive pulse, for example a signal initiated at time $t_5$, applied to point 90 finds flip-flop 84 already in a binary —1— output state at point 68 and consequently does not alter the binary —1— output appearing at point 68 and point 94. This second positive pulse applied at point 90 and then to point 96 at time $t_5$, finds a binary —1— signal at point 94 and a coincident condition occurs resulting in a binary —1— at point 88. Consequently, any succeeding positive pulses, for example at time $t_8$ and $t_{11}$, applied to point 90 will result in a binary —1— at point 88. If such result is not desired a positive pulse, for example at time $t_{13}$, is applied to point 92 which pulse triggers flip-flop 84 and results at time $t_{14}$ in a binary —1— at point 70 and a binary —0— at point 68 and at point 94. This resetting of flip-flop 84 removes the binary —1— from point 94 and precludes the coincidence with a successive positive pulse at point 96 preventing the appearance of a binary —1— at point 88. A subsequent positive pulse, for example at time $t_{15}$, applied at point 90 will trigger flip-flop 84 and at time $t_{16}$ result in a binary —1— at point 68. As discussed hereinbefore such binary —1— does not coincide with the positive pulse applied to point 90 and point 96. This non-coincidence results in a binary —0— at point 88. FIGURE 3 is an illustration of the exemplary waveforms at the indicated points under a sequence of events as outlined above.

Modifications of this invention not described herein will become apparent to those of ordinary skill in the art after reading this disclosure. Therefore, it is intended that the matter contained in the foregoing description and accompanying drawings be interpreted as illustrative and not limitative, the scope of the invention being defined in the appended claims.

What is claimed is:

1. A bistable multivibrator circuit including first and second input circuit means, first and second output terminals, a voltage source, and a semiconductor means having two operating states indicated by relatively high and low voltages on said first and second output terminals and respectively initiated and attained by an input pulse signal on said first and second input circuit means and having at least a first and second active element, each of said active elements having at least three electrodes, one electrode of said first active element being coupled directly to a similar electrode of said second active element, and a constant current source comprising a serially associated inductor and resistor directly coupled to said two directly coupled electrodes coupling them directly to said voltage source.

2. The apparatus of claim 1 wherein the first input circuit means comprises an input terminal and an output terminal, an active element having at least three electrodes, a pulse forming means electrically intermediate said input terminal and a first one of said electrodes, and said output terminal coupled directly to a second one of said electrodes.

3. The apparatus of claim 1 wherein each of the first and second input circuit means comprises an input terminal and an output terminal, an active element having at least three electrodes, a pulse forming means electrically intermediate said input terminal and a first one of said electrodes, and said output terminal coupled directly to a second one of said electrodes.

4. A bistable multivibrator circuit including first and second input circuit means, first and second output terminals, a plurality of voltage sources, and a semiconductor means having two operating states indicated by relatively high and low voltages on said first and second output terminals and respectively initiated and attained by an input pulse signal on said first and second input circuit means, each of said first and second input circuit means including an input terminal and an output terminal, an active element having at least three electrodes, a pulse forming means wherein each pulse forming means includes a serially associated first and second resistive means and an inductive means, the junction of said first and second resistive means coupled directly to said input terminal by a first unidirectional impedance means, the junction of said first resistive means and said inductive means coupled directly to a first of said voltage sources, the junction of said second resistive means and said inductive means coupled directly to a capacitive means the other end of which is coupled directly to a first one of said electrodes, said output terminal coupled directly to a second one of said electrodes, and a second unidirectional impedance means inserted between said capacitive means and the junction of said second resistive means and said inductive means.

5. A semiconductor circuit comprising in combination: a plurality of voltage sources, four transistors each having an emitter, a base, and a collector, a second and third of said transistors serving as a flip-flop, a first and fourth of said transistors functioning as set-reset triggers, the base of each of said second and third transistors coupled directly to the emitter of said first and fourth transistors respectively, first and second resistive means coupling the collector of said second and third transistors directly to the base of said third and second transistors respectively, the collector of said first and fourth transistors coupled directly to a first voltage source, third and fourth resistive means coupling the collector of each of said second and third transistors directly to a second voltage source, fifth and sixth resistive means coupling the base of said first and fourth transistors directly to the collector of said third and second transistors respectively, seventh resistive means coupling the base of said first transistor directly to a third voltage source, eighth resistive means coupling the emitter of said first transistor directly to said third voltage source, ninth resistive means coupling the base of said fourth transistor directly to said third potential, tenth resistive means coupling the emitter of said fourth transistor directly to said third voltage source, serially associated resistive and inductive means coupling the emitters of said second and third transistors directly to a fourth voltage source, first serially associated capacitive, resistive, and unidirectional impedance means respectively coupling the base of said first transistor directly to a first pulse signal input means with a first inductive means coupling the junction of said first serially associated capacitive and resistive means directly to said first voltage source and with an eleventh resistive means coupling the junction of said first serially associated resistive and unidirectional impedance means directly to said first voltage source, second serially associated capacitive, resistive, and unidirectional impedance means respectively coupling the base of said fourth transistor directly to a second pulse signal input means with a second inductive means coupling the junction of said second serially associated capacitive, and resistive means directly to said first voltage source and with a twelfth resistive means coupling the junction of said second serially associated resistive and unidirectional impedance means directly to said first voltage source.

6. The circuit of claim 5 wherein a third unidirectional impedance means is inserted between said first serially associated capacitive means and the junction of said first serially associated resistive means and said first inductive means.

7. The circuit of claim 5 wherein a third unidirectional impedance means is inserted between said first serially associated capacitive means and the junction of said first serially associated resistive means and said first inductive means, and a fourth unidirectional impedance means is inserted between said second serially associated capacitive means and the junction of said second serially associated resistive means and said second inductive means.

8. The circuit of claim 5 wherein said four transistors are of the PNP type, said first and second unidirectional impedance means are oriented so as to present a low impedance to an input pulse of positive polarity.

9. The circuit of claim 6 wherein said four transistors are of the PNP type, said first and second unidirectional impedance means are oriented so as to present a low impedance to an input pulse of positive polarity and said third unidirectional impedance means is oriented so as to present a high impedance to an input pulse of positive polarity.

10. The circuit of claim 7 wherein said four transistors are of the PNP type, said first and second unidirectional impedance means are oriented so as to present a low impedance to an input pulse of positive polarity and said third and fourth unidirectional impedance means are oriented so as to present a high impedance to an input pulse of positive polarity.

11. A bistable multivibrator comprising in combination: a plurality of voltage sources, first and second transistors each having an emitter, a base, and a collector, first and second input means, first and second output means, a constant current source comprising serially associated first resistive means and first inductive means directly connecting the emitters of said first and second transistors to a first voltage source; the collector of said first transistor coupled to the base of said second transistor by a second resistive means, to a second voltage source by a third resistive means, and directly to said first output means; the collector of said second transistor coupled to the base of said first transistor by a fourth resistive means, to a third voltage source by a fifth resistive means, and directly to said second output means; the base of said first transistor coupled directly to said first input means, and the base of said second transistor coupled directly to said second input means.

References Cited in the file of this patent

UNITED STATES PATENTS

| | | |
|---|---|---|
| 2,269,417 | Crosby | Jan. 6, 1942 |
| 2,793,303 | Fleisher | May 21, 1957 |
| 3,034,070 | Wood | May 8, 1962 |
| 3,037,128 | Slobodzinski | May 29, 1962 |
| 3,046,413 | Clapper | July 24, 1962 |
| 3,066,231 | Slobodzinski et al. | Nov. 27, 1962 |

OTHER REFERENCES

Schwartz: "Selected Semiconductor Circuits Handbook," John Wiley, Inc., 1960, page 6.39.